United States Patent
Kaulmann et al.

(10) Patent No.: US 10,734,912 B2
(45) Date of Patent: Aug. 4, 2020

(54) STATOR DEVICE FOR A LINEAR MOTOR, LINEAR DRIVE SYSTEM, AND METHOD FOR OPERATING A STATOR DEVICE

(71) Applicant: BECKHOFF AUTOMATION GMBH, Verl (DE)

(72) Inventors: Tim Kaulmann, Paderborn (DE); Uwe Pruessmeier, Lemgo (DE); Thomas Vorbohle, Rietberg (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 15/682,787

(22) Filed: Aug. 22, 2017

(65) Prior Publication Data

US 2018/0062535 A1 Mar. 1, 2018

Related U.S. Application Data

(60) Provisional application No. 62/378,727, filed on Aug. 24, 2016.

(51) Int. Cl.
*H02M 7/162* (2006.01)
*H02M 5/458* (2006.01)
(Continued)

(52) U.S. Cl.
CPC .... *H02M 7/1626* (2013.01); *G01R 19/16571* (2013.01); *G01R 31/2829* (2013.01);
(Continued)

(58) Field of Classification Search
CPC .... H02M 7/1626; H02M 1/32; H02M 5/4585; H02M 7/797; H02M 2001/008;
(Continued)

(56) References Cited

U.S. PATENT DOCUMENTS 4,053,820 A * 10/1977 Peterson ............... H02J 3/01
 363/44
4,663,702 A * 5/1987 Tanaka ............... H02M 5/4505
 363/65
(Continued)

FOREIGN PATENT DOCUMENTS

DE 102009001337 A1 9/2010
DE 102009054785 A1 1/2011
(Continued)

*Primary Examiner* — Jorge L Carrasquillo
*Assistant Examiner* — Devon A Joseph
(74) *Attorney, Agent, or Firm* — Dorsey & Whitney LLP

(57) ABSTRACT

A linear motor comprises a stator, the stator comprising multiple drive coils and an intermediate circuit electrically conductively connected to each drive coil, the intermediate circuit being configured to exchange energy with each drive coil. The drive coils are arranged along the running rail, where at least one slide comprising a magnet acting as a rotor of the linear motor is movably arranged on the running rail. A controller is configured to independently control each drive coil, so that electrical energy is fed from the intermediate circuit into the drive coils, if a measured intermediate circuit voltage is greater or equal to a predetermined intermediate circuit voltage threshold value, where those drive coils are excluded from the feed-in of the electrical energy which are instantaneously being used for driving or braking the at least one slide and/or have a thermal load which exceeds a predetermined thermal load threshold value.

15 Claims, 5 Drawing Sheets

US 10,734,912 B2

Page 2

(51) Int. Cl.
*G01R 19/165* (2006.01)
*H02P 6/00* (2016.01)
*H02K 7/12* (2006.01)
*H02M 7/797* (2006.01)
*H02K 41/03* (2006.01)
*H02M 1/32* (2007.01)
*H02P 25/06* (2016.01)
*G01R 31/28* (2006.01)
*G01R 31/34* (2020.01)
*H02P 3/14* (2006.01)
*H02P 3/22* (2006.01)
*H02M 1/00* (2006.01)

(52) U.S. Cl.
CPC ........... *G01R 31/343* (2013.01); *H02K 7/125* (2013.01); *H02K 41/031* (2013.01); *H02M 1/32* (2013.01); *H02M 5/4585* (2013.01); *H02M 7/797* (2013.01); *H02P 6/006* (2013.01); *H02P 25/06* (2013.01); *H02M 2001/008* (2013.01); *H02M 2001/327* (2013.01); *H02P 3/14* (2013.01); *H02P 3/22* (2013.01)

(58) Field of Classification Search
CPC .. H02M 2001/327; H02P 6/006; H02P 25/06; H02P 3/14; H02P 3/22; G01R 19/16571; G01R 31/2829; G01R 31/343; H02K 7/125; H02K 41/031
USPC .......................................................... 318/687
See application file for complete search history.

(56) References Cited

U.S. PATENT DOCUMENTS

| | | | | |
|---|---|---|---|---|
| 4,816,736 A * | 3/1989 | Dougherty | ............ | H02J 7/1423 320/116 |
| 5,093,583 A * | 3/1992 | Mashino | ................ | H02P 9/307 307/10.1 |
| 5,345,375 A * | 9/1994 | Mohan | ..................... | H02J 3/01 307/105 |
| 5,499,178 A * | 3/1996 | Mohan | ..................... | H02J 3/01 307/105 |
| 5,515,264 A * | 5/1996 | Stacey | .................... | H02M 7/49 363/132 |
| 5,719,486 A * | 2/1998 | Taniguchi | ............ | H02J 7/1438 322/24 |
| 5,726,557 A * | 3/1998 | Umeda | ..................... | H02J 7/14 320/104 |
| 5,889,667 A * | 3/1999 | Bernet | ................... | H02M 7/797 323/239 |
| 5,892,677 A * | 4/1999 | Chang | ................... | H02M 5/297 363/152 |
| 6,134,126 A * | 10/2000 | Ikekame | ................... | H02J 3/01 307/105 |
| 6,236,580 B1 * | 5/2001 | Aiello | ..................... | H02M 7/49 363/37 |
| 6,301,130 B1 * | 10/2001 | Aiello | ..................... | H02M 7/49 363/37 |
| 6,320,767 B1 * | 11/2001 | Shimoura | ............... | H02M 7/49 363/37 |
| 6,392,348 B1 * | 5/2002 | Dougherty | ............ | H02J 7/1423 315/82 |
| 7,095,952 B2 * | 8/2006 | Lelkes | ..................... | H02P 6/085 318/400.01 |
| 7,102,323 B2 * | 9/2006 | Zhou | ...................... | H02P 6/181 318/800 |
| 7,112,936 B2 * | 9/2006 | Lee | ........................... | H02P 6/10 318/400.01 |
| 7,197,390 B2 * | 3/2007 | Yuan | ................... | B60L 15/2045 318/437 |
| 7,208,897 B2 * | 4/2007 | Hotto | .................... | G05B 19/042 318/282 |
| 7,298,115 B2 * | 11/2007 | Nishimura | ................ | H02P 9/30 322/28 |
| 7,394,228 B2 * | 7/2008 | Lim | ....................... | H02P 25/092 290/1 R |
| 7,638,890 B2 * | 12/2009 | Lando | ..................... | F01D 15/10 290/36 R |
| 7,697,826 B2 * | 4/2010 | Reutlinger | ............ | B25B 21/008 388/800 |
| 7,894,211 B2 * | 2/2011 | Tyagi | ........................ | H02P 9/48 363/15 |
| 8,030,868 B2 * | 10/2011 | Yamagishi | ................ | E01H 5/04 318/400.41 |
| 8,283,813 B2 * | 10/2012 | Gilchrist | .................. | H02K 7/09 310/114 |
| 8,308,422 B2 * | 11/2012 | Williams | ................ | F03B 3/126 415/7 |
| 8,344,572 B2 * | 1/2013 | Moellgaard | ............... | H02K 3/28 310/179 |
| 8,466,595 B2 * | 6/2013 | Spooner | ................ | F03B 13/083 310/216.002 |
| 8,476,794 B2 * | 7/2013 | Amutham | .............. | H02K 21/22 310/216.021 |
| 8,525,468 B2 * | 9/2013 | Winterhalter | ........... | H02P 27/06 318/798 |
| 8,596,964 B2 * | 12/2013 | Ives | ........................ | F03B 3/126 415/121.2 |
| 8,651,405 B2 * | 2/2014 | Berndzen | ............. | B02C 15/006 241/117 |
| 8,659,205 B2 * | 2/2014 | Moura | .................... | H02K 29/03 310/156.74 |
| 8,672,069 B2 * | 3/2014 | Cherney | .................. | B60K 6/46 180/65.245 |
| 8,680,803 B2 * | 3/2014 | Krupyshev | ........ | H01L 21/67742 318/568.21 |
| 8,688,345 B2 * | 4/2014 | Boughtwood | .......... | B60L 50/52 701/71 |
| 8,690,526 B2 * | 4/2014 | Dunne | .................... | F03B 11/06 415/123 |
| 8,736,133 B1 * | 5/2014 | Smith | ...................... | H02K 21/24 310/208 |
| 8,749,192 B2 * | 6/2014 | Li | ............................. | H02K 3/28 318/799 |
| 8,754,540 B2 * | 6/2014 | Ives | ........................ | F03B 13/10 290/42 |
| 8,784,005 B2 * | 7/2014 | Ives | ........................ | H02G 1/10 405/169 |
| 8,803,513 B2 * | 8/2014 | Hosek | .................... | G01B 7/003 324/207.15 |
| 8,823,241 B2 * | 9/2014 | Jore | ........................ | H02K 1/12 310/268 |
| 8,823,294 B2 * | 9/2014 | Hosek | ................. | F16C 32/0493 318/115 |
| 8,864,439 B2 * | 10/2014 | Williams | ................ | F03B 13/10 415/3.1 |
| 8,872,371 B2 * | 10/2014 | Ives | ........................ | F03B 15/00 290/42 |
| 8,933,598 B2 * | 1/2015 | Dunne | .................... | H02K 1/20 310/52 |
| 8,941,961 B2 * | 1/2015 | Banerjee | ................. | H02H 7/06 361/87 |
| 9,054,512 B2 * | 6/2015 | Ives | ........................ | H02G 1/10 |
| 9,059,659 B2 * | 6/2015 | Burke | ..................... | H02K 3/28 |
| 9,103,322 B2 * | 8/2015 | Jeon | ....................... | H02K 53/00 |
| 9,154,024 B2 * | 10/2015 | Jore | ........................ | H02K 1/30 |
| 9,234,492 B2 * | 1/2016 | Dunne | .................... | E02D 15/08 |
| 9,236,725 B2 * | 1/2016 | Ives | ........................ | F03B 13/264 |
| 9,257,926 B2 * | 2/2016 | Pettigrew | ............. | B60L 3/0061 |
| 9,284,709 B2 * | 3/2016 | Ives | ........................ | E02D 15/08 |
| 9,454,638 B2 * | 9/2016 | Fujinaga | ................ | G06F 30/15 |
| 9,473,046 B2 * | 10/2016 | Spooner | ................ | H02J 3/36 |
| 9,583,989 B2 * | 2/2017 | Gentile | .................... | H02K 5/04 |
| 9,608,557 B2 * | 3/2017 | Clausen | ................... | A47B 9/00 |
| 9,654,032 B2 * | 5/2017 | Barrass | ................... | H02P 6/34 |
| 9,752,615 B2 * | 9/2017 | Hosek | ................ | F16O 32/0444 |

(56) References Cited

U.S. PATENT DOCUMENTS

| | | | |
|---|---|---|---|
| 9,765,647 B2 * | 9/2017 | Ives | F03B 13/264 |
| 9,944,349 B2 * | 4/2018 | Biderman | B60B 7/04 |
| 10,005,317 B2 * | 6/2018 | Biderman | B60L 3/12 |
| 10,177,620 B2 * | 1/2019 | Smith | H02K 3/28 |
| 10,259,311 B2 * | 4/2019 | Biderman | G08G 1/052 |
| 10,282,194 B2 * | 5/2019 | Martin | G06F 8/654 |
| 10,308,065 B2 * | 6/2019 | Biderman | B60L 3/12 |
| 10,312,774 B2 * | 6/2019 | Dumas | H02P 27/08 |
| 2003/0202367 A1 * | 10/2003 | Schreiber | H02J 3/38 |
| | | | 363/72 |
| 2004/0021437 A1 * | 2/2004 | Maslov | B60L 8/00 |
| | | | 318/400.01 |
| 2005/0146226 A1 * | 7/2005 | Trainer | H02M 1/4233 |
| | | | 307/73 |
| 2008/0007978 A1 * | 1/2008 | Han | H02M 7/487 |
| | | | 363/35 |
| 2009/0027934 A1 * | 1/2009 | Robledo Bustos | H02M 7/2173 |
| | | | 363/126 |
| 2009/0102436 A1 * | 4/2009 | Escobar Valderrama | |
| | | | H02J 3/1857 |
| | | | 323/207 |
| 2009/0243522 A1 * | 10/2009 | Suhama | B60L 15/025 |
| | | | 318/376 |
| 2010/0067266 A1 * | 3/2010 | Dommaschk | H02M 7/483 |
| | | | 363/64 |
| 2010/0134057 A1 * | 6/2010 | Focking | H02H 7/0838 |
| | | | 318/400.22 |
| 2011/0018481 A1 * | 1/2011 | Hiller | H02M 7/483 |
| | | | 318/400.26 |
| 2012/0069610 A1 * | 3/2012 | Trainer | H02M 7/483 |
| | | | 363/35 |
| 2013/0099705 A1 * | 4/2013 | Iwashita | H02M 5/458 |
| | | | 318/400.22 |
| 2013/0128629 A1 * | 5/2013 | Clare | H02M 1/15 |
| | | | 363/35 |

FOREIGN PATENT DOCUMENTS

| | | |
|---|---|---|
| DE | 102012020473 A1 | 10/2012 |
| EP | 1950878 A1 | 7/2008 |
| WO | 2008122602 A1 | 10/2008 |

* cited by examiner

STATOR DEVICE FOR A LINEAR MOTOR, LINEAR DRIVE SYSTEM, AND METHOD FOR OPERATING A STATOR DEVICE

CROSS-REFERENCE TO RELATED APPLICATION

This application claims priority to U.S. Provisional Application No. 62/378,727 filed Aug. 24, 2016, which is incorporated by reference herein, in its entirety and for all purposes.

FIELD

The present invention relates to a stator device for a linear motor. The present invention furthermore relates to a linear drive system. In addition, the present invention relates to a method for operating a stator device.

BACKGROUND

Published patent application DE 10 2012 020 473 A1 shows a motor control device including a reactive current instruction generation unit. It is provided that a voltage is detected on a direct-current output side of a converter, wherein a numerical control unit causes an inverter to generate a reactive current, in order thereby to increase the current absorbed by the motor. It is thereby intended that an intermediate circuit voltage is reduced. The reactive current is intended to lead to power dissipation in the motor.

Published patent application DE 10 2012 020 473 A1 is thus directed to a three-phase system having half bridges interlinked via the motor.

Published patent application DE 10 2009 054 785 A1 shows a brake chopper. Published patent application DE 10 2009 054 785 A1 describes how standard bridge arms of a motor module may be connected in order to convert the electrical energy of a voltage source into thermal energy in the braking resistors.

It is thus provided that braking resistors are connected to the motor module. In the case of such a brake chopper, it is intended to be possible to connect half bridges. Published patent application DE 10 2009 054 785 A1 is designed for a three-phase alternating current system.

In linear motors which drive a slide, in the case of abrupt braking actions by the slide, energy is generally fed back into the intermediate circuit, possibly resulting in an abrupt increase in the intermediate circuit voltage.

The excess energy may, for example, be dissipated via an external chopper device. In the case of dynamic applications using a large number of slides, and in the case of a high load, for example, overloading of the external chopper device may occur. In the case of overloading, for example, the external chopper resistor is not further loaded. In such a case, for example, an overvoltage is detected during a next braking operation, thus resulting, for example, in a deactivation of the linear motor for safety reasons. This leads, for example, to downtime of the linear motor.

SUMMARY

The present invention provides an efficient concept, in the case of overloading, for a stator device used for a linear motor and for a linear drive system. In addition, the present invention provides an efficient operation concept, in the case of overloading, for a stator device.

EXAMPLES

According to one aspect, a stator device for a linear motor is provided, comprising: multiple drive coils, which are respectively electrically conductively connected to an intermediate circuit by their own DC voltage converter, so that by the respective DC voltage converter, electrical energy may be fed from the intermediate circuit into the respective drive coil, or electrical energy may be fed from the respective drive coil into the intermediate circuit; a voltage measuring device for measuring an intermediate circuit voltage; a control device for controlling the DC voltage converter, wherein the control device is configured to control at least one of the DC voltage converters in such a way that electrical energy is fed from the intermediate circuit into the drive coil corresponding to the controlled DC voltage converter, if the measured intermediate circuit voltage is greater than, or greater than or equal to, a predetermined intermediate circuit voltage threshold value.

According to a further aspect, a linear drive system is provided, comprising: a linear motor comprising the stator device for a linear motor, a running rail on which one or multiple slides are movably arranged, wherein the slide(s) respectively comprise a magnet acting as a rotor of the linear motor, wherein the drive coils are arranged along the running rail.

According to another aspect, a method is provided for operating a stator device for a linear motor, comprising the following steps: measuring an intermediate circuit voltage by the voltage measuring device, controlling at least one DC voltage converter by the control device in such a way that electrical energy is fed from the intermediate circuit into the drive coil corresponding to the controlled DC voltage converter, if the measured intermediate circuit voltage is greater than, or greater than or equal to, a predetermined intermediate circuit voltage threshold value.

According to another aspect, a computer program is provided which comprises program code for carrying out the method for operating a stator device for a linear motor, if the computer program is executed on a computer.

The concept is based on the finding that the above object may be achieved in that electrical energy which corresponds to an overvoltage in the intermediate circuit is diverted into the drive coils. By electrically conductively connecting the drive coils to the intermediate circuit by their own DC voltage converter, in particular this results in the technical advantage that the energy to be fed from the intermediate circuit into the respective drive coils may be controlled or regulated independently. The respective direct current which is impressed on the drive coils in order to divert the energy from the intermediate circuit, may thus be controlled independently. By diverting energy from the intermediate circuit into the drive coils, an intermediate circuit voltage will drop, so that the overvoltage may be efficiently counteracted.

In the case of an overvoltage in the intermediate circuit, electrical energy may be efficiently diverted from the intermediate circuit. This in particular results in the technical advantage that an overvoltage in the intermediate circuit may be avoided. This results, for example, in the technical advantage that the linear motor does not have to be deactivated due to an overvoltage in the intermediate circuit. This results, for example, in the technical advantage that downtime of the linear motor may be avoided. This results, for example, in the technical advantage that the linear motor may be efficiently operated. In particular, this results in the technical advantage that the intermediate circuit may be efficiently protected from an overvoltage, so that advantageously, damage to electrical components of the intermediate circuit may thereby be efficiently avoided. This in particular results in the technical advantage that a linear drive system does not have to be equipped and/or retrofitted with a special braking resistor.

According to one embodiment, it is provided that the drive coils and their corresponding own DC voltage converters are respectively interconnected as a bridge circuit, wherein the drive coils respectively form a bridge arm of the bridge circuit.

The drive coils are efficiently interconnected with their respective DC voltage converters. In particular, this thereby results in the technical advantage that the coil may be efficiently integrated into the DC voltage converter.

According to one embodiment, a bridge circuit is configured as a full bridge or as a circuit made up of half bridges. The multiple bridge circuits are, for example, configured identically or differently.

According to one embodiment, it is provided that the control device is configured to select only DC voltage converters, of which the corresponding drive coils meet one or multiple predetermined criteria, as the at least one DC voltage converter.

The linear motor may be efficiently operated. In particular, this results in the technical advantage that, by specifying the criteria, it is possible to efficiently influence which of the drive coils are used to divert energy from the intermediate circuit.

It thus means in particular that only drive coils which fulfill one or a plurality of the predetermined criteria are used as the drive coils in which energy is to be diverted, respectively, is diverted, from the intermediate circuit.

The electrical energy to be diverted, which, for example, may be described as excess energy, refers in particular to the component of the electrical energy stored in the intermediate circuit which corresponds to an overvoltage. For example, electrical energy is diverted until an overvoltage is dissipated in the intermediate circuit.

In one embodiment, it is provided that the control device is configured to ascertain a respective thermal load of the drive coils, wherein the criterion or the multiple criteria comprise a respective ascertained thermal load of the corresponding drive coils being smaller than a predetermined thermal load threshold value.

The linear motor may be efficiently operated. In particular, this results in the technical advantage that a thermal load of the drive coils may be efficiently avoided due to the diversion of the excess energy from the intermediate circuit. It thus means in particular that only those drive coils which have a thermal load which is smaller than a predetermined thermal load threshold value are used as drive coils to divert energy from the intermediate circuit.

The thermal load is, for example, ascertained based on a thermal model. In such a thermal model, for example, measured drive coil values from the past are included as input variables. This means, for example, that according to one embodiment, an instantaneous thermal load of the corresponding drive coil is ascertained, based on past drive coil current values. The higher a past current in the drive coils was, the higher a corresponding instantaneous thermal load generally is.

In one embodiment, it is provided that the criterion or the multiple criteria comprise the corresponding drive coils instantaneously not participating in controlling the drive of a magnetic rotor.

The linear motor may be efficiently operated. In particular, this results in the technical advantage that the magnetic rotor may be efficiently driven. In particular, this results in the technical advantage that controlling a drive of a magnetic rotor is not disturbed.

It thus means in particular that only the drive coils which are instantaneously not driving the magnetic rotor are used as drive coils to divert energy from the intermediate circuit due to an overvoltage.

The magnetic rotor comprises, for example, a permanent magnet.

For example, multiple magnetic rotors are provided.

According to another embodiment, it is provided that a position detection device is provided for detecting a position of a magnetic rotor, wherein the criterion or the multiple criteria comprise the detected position of the magnetic rotor not being opposite the corresponding drive coils.

The linear motor may be efficiently operated. In particular, this results in the technical advantage that it may be ensured that only drive coils which are instantaneously not driving the magnetic rotor are used to divert the excess energy from the intermediate circuit.

The movement of the magnetic rotor is not disturbed due to the diversion of the excess energy from the intermediate circuit.

In one embodiment, it is provided that the linear drive system is configured or furnished to execute or carry out the method for operating a stator device.

In one embodiment, it is provided that the stator device according to the method for operating a stator device is comprised by the linear drive system. The method for operating a stator device may then also be referred to as a method for operating linear drive system.

According to one embodiment, it is provided that the stator device is configured or furnished to execute or carry out the method for operating a stator device.

Technical functionalities of the method for operating a stator device result analogously from corresponding technical functionalities of the stator device, and vice-versa. It thus means in particular that corresponding method features result from corresponding stator device features, and vice-versa.

Technical functionalities of the linear drive system result analogously from corresponding technical functionalities of the stator device, respectively, the method, for operating a stator device, and vice-versa.

In the context of the description, a linear motor comprises in particular the stator device and a magnetic rotor or multiple magnetic rotors, respectively, a magnet acting as a rotor, respectively, multiple magnets acting as a rotor. In the context of this description, rotors comprising a magnet, magnetic rotors, and magnets acting as a rotor may be used synonymously.

In the linear drive system, the rotor is arranged on the slide. When the drive coils are supplied with current, they generate a magnetic field which interacts with the magnetic field of the rotor, so that either an attractive or repulsive force thereby results, which either attracts the rotor to the coil or repels it from the coil. Thus, the slide may be driven or braked.

The formulation "respectively" may comprise in particular the formulation "and/or."

In the context of the description, a magnet is, for example, a permanent magnet.

In one embodiment, it is provided that a rectifier is connected to the intermediate circuit.

In one embodiment, it is provided that an AC voltage source or an alternating current source is connected to the rectifier. For example, a three-phase current source is connected to the rectifier.

In one embodiment, it is provided that the control device is configured to drive the at least one of the DC voltage converters in such a way that feeding the electrical energy from the intermediate circuit into the drive coil corresponding to the controlled DC voltage converter is terminated if the measured intermediate circuit voltage is less than, or less than or equal to, a predetermined additional intermediate circuit voltage threshold value. The additional intermediate circuit voltage threshold value is less than the predetermined intermediate circuit voltage threshold value. This means, for example, that the diversion of the excess energy is preferably terminated if the measured intermediate circuit voltage is less than, or less than or equal to, the predetermined additional intermediate circuit voltage threshold value.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. Here in schematic illustration in each case.

DETAILED DESCRIPTION

The invention will be illustrated and described in detail with the aid of the preferred exemplary embodiments. Nevertheless, the invention is not restricted to the examples disclosed. Rather, other variants may be derived therefrom by a person skilled in the art without departing from the protective scope of the invention.

Figure 1:
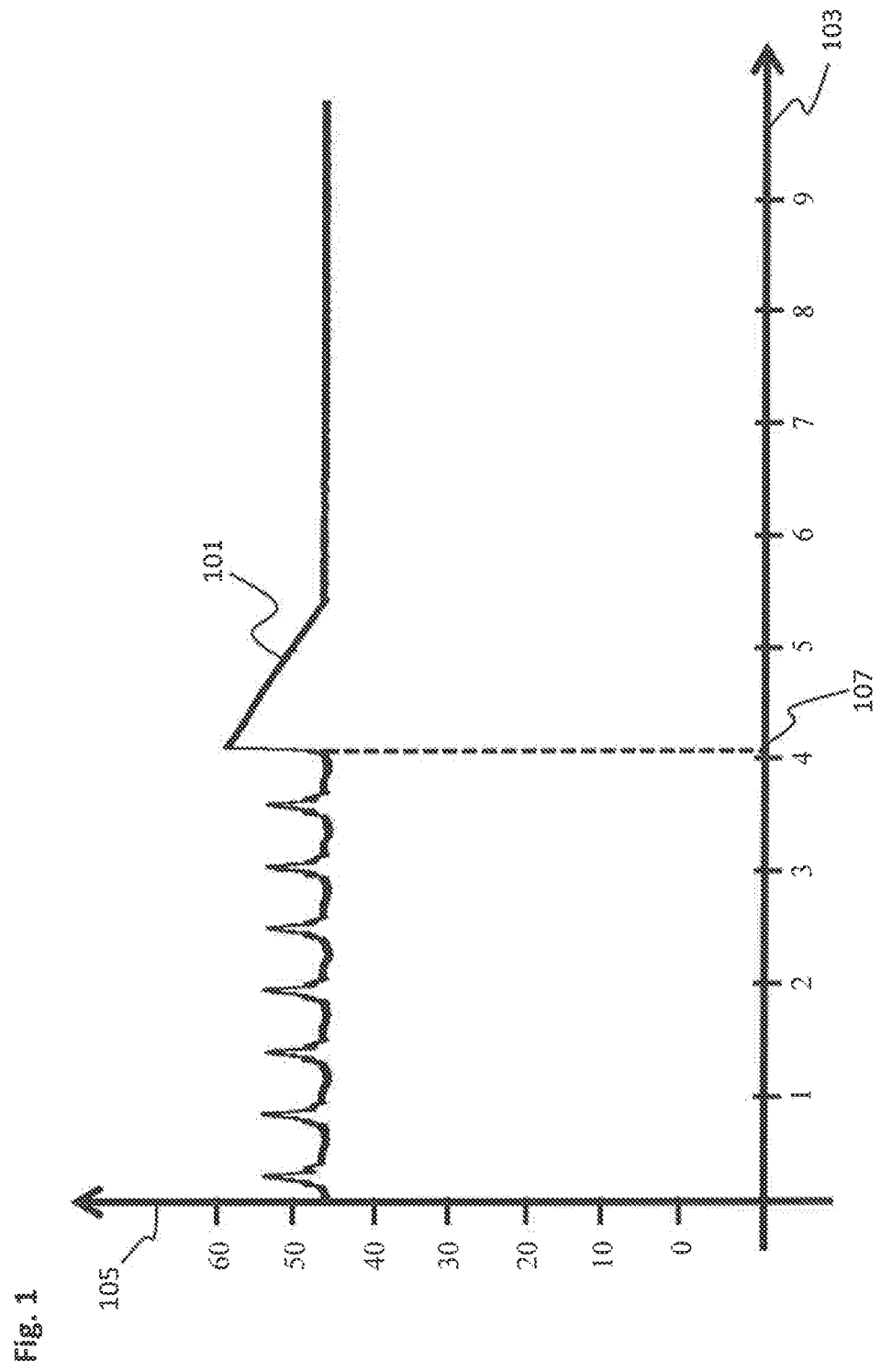
FIG. 1 shows a temporal voltage curve of an intermediate circuit voltage.

FIG. 1 shows a temporal curve 101 of an intermediate circuit voltage in a linear drive system.

The abscissa is labeled with the reference numeral 103 and indicates time in seconds.

The ordinate is labeled with the reference numeral 105 and indicates the intermediate circuit voltage in volts.

Between 0 seconds and 4 seconds, multiple braking actions of a slide of the drive system are carried out, resulting in a feedback of energy to the intermediate circuit. This feedback of energy manifests itself in an increase in the intermediate circuit voltage.

Between 0 seconds and 4 seconds, an external chopper device is active. Said chopper device diverts the excess energy from the intermediate circuit.

After the fourth second, the chopper device is deactivated, so that an overvoltage occurs in the intermediate circuit in the case of further braking of the slide. The point in time at which the intermediate circuit voltage abruptly increases is indicated in FIG. 1 by the reference numeral 107.

This overvoltage is generally identified or detected, resulting in a disconnection of the linear motor for safety reasons. This results in downtime of the linear drive system.

Figure 2:
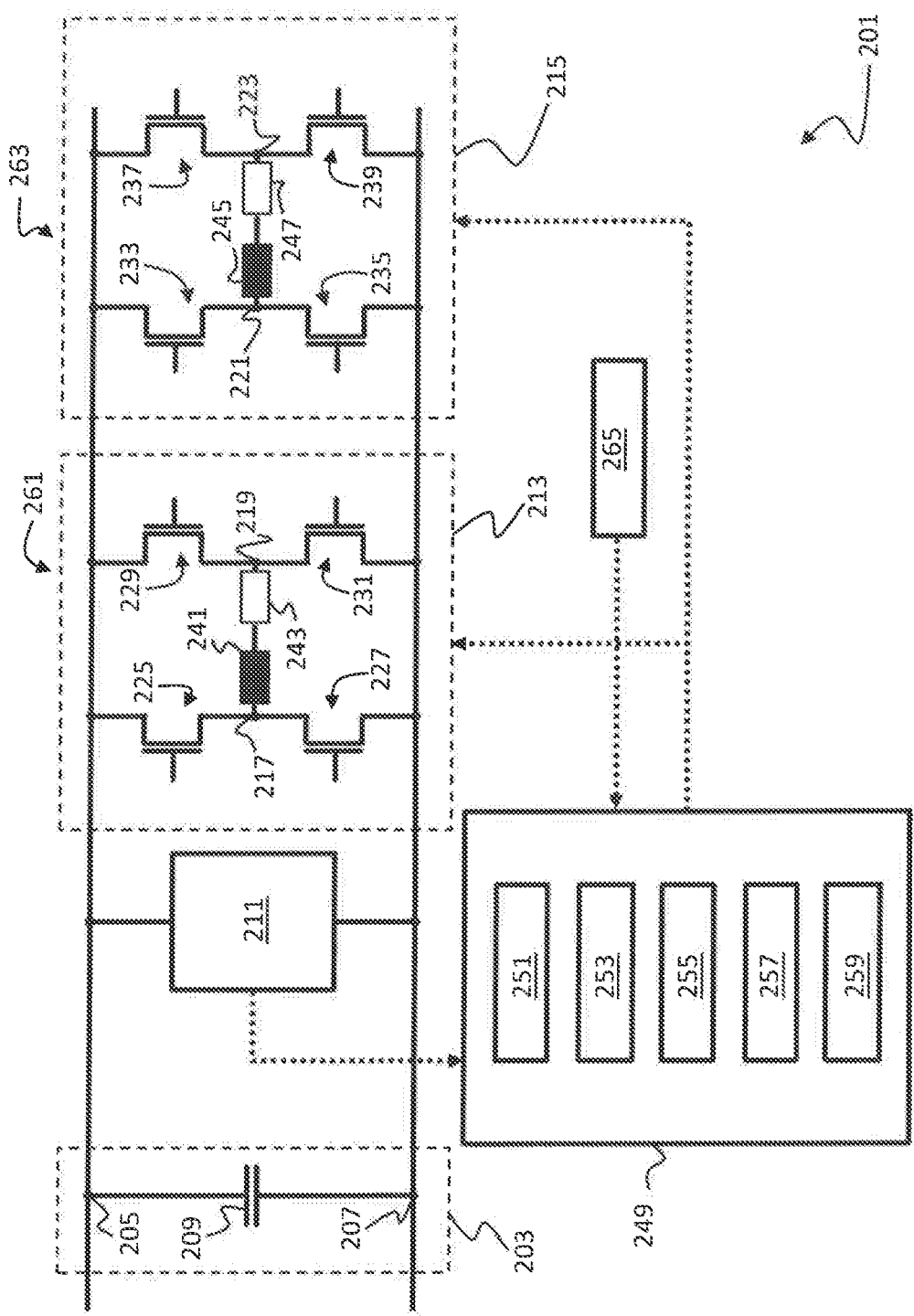
FIG. 2 shows a stator device for a linear motor.

FIG. 2 shows a circuit arrangement of a stator device 201 for a linear motor.

The stator device 201 comprises an intermediate circuit 203. The intermediate circuit 203 comprises a first circuit node 205 and a second circuit node 207. A capacitor 209 is connected between the first circuit node 205 and the second circuit node 207, and may also be referred to as an intermediate-circuit capacitor.

The stator device 201 comprises a voltage measuring device 211 for measuring an intermediate circuit voltage. The voltage measuring device 211 is connected in parallel with the capacitor 209 between the first circuit node 205 and the second circuit node 207.

The stator device 201 comprises a first bridge circuit 213 and a second bridge circuit 215.

The first bridge circuit 213 comprises a third circuit node 217 and a fourth circuit node 219.

The second bridge circuit 215 comprises a fifth circuit node 221 and a sixth circuit node 223.

The first bridge circuit 213 comprises a first transistor 225, a second transistor 227, a third transistor 229, and a fourth transistor 231.

The second bridge circuit 215 comprises a fifth transistor 233, a sixth transistor 235, a seventh transistor 237, and an eighth transistor 239.

The transistors of the two bridge circuits 213, 215 are, for example, exemplary placeholders for semiconductor switching elements. In further embodiments, the transistors of the bridge circuits 213, 215 are respectively bipolar transistors or metal-oxide-semiconductor field-effect transistors.

The transistors of the two bridge circuits 213, 215 thus assume in particular the function of a semiconductor switching element and are, for example, bipolar transistors or metal-oxide-semiconductor field-effect transistors.

The transistors of the two bridge circuits 213, 215 are, for example, configured identically or, for example, configured differently.

In the context of the description, a transistor is, for example, a bipolar transistor or a metal-oxide-semiconductor field-effect transistor (MosFET) or a SiC/GaN FET.

The first bridge circuit 213 comprises a first drive coil 241. The first drive coil 241 is connected between the third circuit node 217 and the fourth circuit node 219.

The first drive coil 241 has a first inner resistance which, according to an equivalent circuit diagram, is connected as a resistor 243 between the first drive coil 241 and the fourth circuit node 219.

It thus means that according to the equivalent circuit diagram, the first drive coil 241 and the first inner resistor 243 are connected in series between the third circuit node 217 and the fourth circuit node 219.

The second bridge circuit 215 comprises a second drive coil 245. The second drive coil 245 is connected between the fifth circuit node 221 and the sixth circuit node 223.

The second drive coil 245 has a second inner resistance which, according to an equivalent circuit diagram, is connected as a resistor 247 between the second drive coil 245 and the sixth circuit node 223.

It thus means that according to the equivalent circuit diagram, the second drive coil 245 and the second inner resistor 247 are connected in series between the fifth circuit node 221 and the sixth circuit node 223.

A collector of the first transistor 225 of the first bridge circuit 213 is connected to the first circuit node 205. An emitter of the first transistor 225 of the first bridge circuit 213 is connected to the third circuit node 217.

If, by way of example, a MosFET is used as one of the transistors, the term "collector" is to be replaced by "drain" and the term "emitter" is to be replaced by "source" in the above embodiments and in following embodiments.

A collector of the second transistor 227 of the first bridge circuit 213 is connected to the third circuit node 217. An emitter of the second transistor 227 of the first bridge circuit 213 is connected to the second circuit node 207.

A collector of the third transistor 229 of the first bridge circuit 213 is connected to the first circuit node 205. An emitter of the third transistor 229 of the first bridge circuit 213 is connected to the fourth circuit node 219.

A collector of the fourth transistor 231 of the first bridge circuit 213 is connected to the fourth circuit node 219. An emitter of the fourth transistor 231 of the first bridge circuit 213 is connected to the second circuit node 207.

A collector of the fifth transistor 233 of the second bridge circuit 215 is connected to the first circuit node 205. An emitter of the fifth transistor 233 of the second bridge circuit 215 is connected to the fifth circuit node 221.

A collector of the sixth transistor 235 of the second bridge circuit 215 is connected to the fifth circuit node 221. An emitter of the sixth transistor 235 of the second bridge circuit 215 is connected to the second circuit node 207.

A collector of the seventh transistor 237 of the second bridge circuit 215 is connected to the first circuit node 205. An emitter of the seventh transistor 237 of the second bridge circuit 215 is connected to the sixth circuit node 223.

A collector of the eighth transistor 239 of the second bridge circuit 215 is connected to the sixth circuit node 223. An emitter of the eighth transistor 239 of the second bridge circuit 215 is connected to the second circuit node 207.

In the context of the description, connecting, or a connection, is in particular connecting electrically, respectively, an electrical connection, respectively, connecting electrically conductively, respectively, an electrically conductive connection.

The two bridge circuits 213, 215 are respectively configured as a full bridge or as an H bridge. The two drive coils 241, 245 respectively form a bridge arm of the two bridge circuits 213, 215.

In an embodiment which is not shown, instead of the full bridge, a circuit made of half bridges is provided as a bridge circuit.

The four transistors 225, 227, 229, 231 of the first bridge circuit 213 form a first DC voltage converter 261 which electrically conductively connects the first drive coil 241 to the intermediate circuit 203.

The four transistors 233, 235, 237, 239 of the second bridge circuit 215 form a second DC voltage converter 263 which electrically conductively connects the second drive coil 245 to the intermediate circuit 203.

For example, a rectifier may be connected to the intermediate circuit 203, and is, for example, connected by a three-phase voltage source or current source.

The stator device 201 furthermore comprises a control device 249. The control device 249 comprises multiple functions, which are symbolically depicted by boxes.

Thus, the control device 249 is configured to monitor the measured intermediate circuit voltage. The control device 249 thus has a voltage monitoring function 251. For example, the control device 249 comprises a voltage monitoring unit for monitoring the measured intermediate circuit voltage.

The control device 249 is furthermore configured to monitor a controller request for controlling the drive coils 241, 245. It thus means that the control device 249 has a controller request monitoring function 253. For example, the control device 249 comprises a controller request monitoring unit 253.

The controller request monitoring function 253 in particular causes monitoring to be performed of which of the drive coils 241, 245 is requested, respectively, is in use, for controlling a drive of a magnetic rotor which is comprised in a slide to be driven. Thus, it is in particular monitored which of the drive coils 241, 245 are instantaneously being used to drive a slide.

The control device 249 is furthermore configured to identify unused bridge circuits 213, 215. It thus means that the control device 249 has an identification function 255 for identifying unused full bridges. For example, the control device 249 comprises an identification unit for identifying unused full bridges or bridge circuits.

It thus means that the control device 249 identifies those bridge circuits 213, 215 which are instantaneously not being used, i.e., are unused, i.e., in particular are not being used for driving a slide.

The control device 249 is furthermore configured to monitor the drive coils 241, 245 thermally. It thus means that the control device 249 has a thermal monitoring function 257 for thermally monitoring the drive coils 241, 245. For example, the control device 249 comprises a thermal monitoring unit for monitoring the thermal load of the drive coils 241, 245. Thermal monitoring comprises in particular monitoring an instantaneous thermal load.

It thus means in particular that the control device 249 ascertains an instantaneous thermal load of the drive coils 241, 245. For example, the ascertainment of the instantaneous thermal load is based on a thermal model. For example, a past drive coil current is provided as an input variable for the thermal model. It thus means that it is ascertained how high an instantaneous thermal load of the corresponding drive coil is, based on a past drive coil current.

The control device 249 is furthermore configured to generate an active current request. It thus means in particular that the control device 249 has an active current request generation function 259. For example, the control device 249 comprises an active current request generation unit.

It thus means in particular that the control device 249 generates a request which requests an active current. This request thus specifies which of the drive coils 241, 245 are to be supplied with an active current in order to divert excess electrical energy from the intermediate circuit 203 into the corresponding drive coil.

The control device 249 is, for example, configured as a numerical control device.

It thus means in particular that the control device 249 monitors the intermediate circuit voltage during the operation of the stator device 201 which, for example, is comprised in a linear drive system. If the measured intermediate circuit voltage exceeds a predetermined intermediate circuit voltage threshold value, at least one of the drive coils 241, 245 is used to divert the excess energy from the intermediate circuit 203, by supplying the corresponding drive coils with an electric current, the active current. It thus means that, for example, a direct current (which is an active current) is impressed on the corresponding drive coils 241, 245.

In order to determine which drive coil is the drive coil into which the excess electrical energy is to be fed, it is, for example, provided that those drive coils are excluded from the feed-in of the excess energy which are instantaneously being used for controlling a drive of a slide of the linear drive system. Thus, in particular those bridge circuits 213, 215 are identified which are not instantaneously required for driving a slide.

In particular, it is provided that only those drive coils 241, 245 having a thermal load which is less than a predetermined thermal load threshold value, are used to divert the excess energy.

Furthermore, based on the measured intermediate circuit voltage, an active current is ascertained which is required to divert the excess energy from the intermediate circuit 203. This ascertained active current is, for example, distributed to the drive coils 241, 245 in order to divert the excess energy across the two drive coils 241, 245.

By electrically conductively connecting the respective drive coils 241, 245 to the intermediate circuit 203 via their own DC voltage converter, here, the respective four transistors, in particular the technical advantage is achieved that the active current which may be impressed on the individual coils 241, 245 may be controlled independently. It thus means that a determined active current may be controlled for each of the drive coils 241, 245 independently, in order to correspondingly divert electrical energy from the intermediate circuit 203.

Thus, a bridge circuit 213, 215 forms a single-phase system. This is in particular to be viewed in contrast to the related art mentioned in the introduction to the description, which generally shows three-phase systems having half bridges interlinked via a motor. According to embodiments, full bridges are provided, not half bridges. The drive coils 241, 245 are thus respectively integrated into the bridge circuits, i.e., into the DC voltage converters.

Thus, multiple independent single-phase systems are formed corresponding to the number of drive coils, in which each full bridge system (i.e., each bridge circuit) may be controlled independently of the other phases.

By the control device 249, it is in particular made possible to couple the independent single-phase systems to one another, in order to generate n-phase systems locally. It is thus in particular made possible that in the case of such a coupled system, for example, all three phases of an exemplary three-phase system may carry independent currents. Here, for example, software which is executed on the control device 249 ensures that during controlled operation, the phase relationships are maintained if the slides are to be driven.

For chopper operation, i.e., during braking operation when feeding back electrical energy, this is generally not relevant, since only individual full bridges previously identified as suitable are used there as independent single-phase systems.

During chopper operation, for example, no moving part, i.e., no slide, is being controlled via the identified single-phase systems, so that the overvoltage-dependent current flowing through the inner resistor 243, 247 of the drive coils 241, 245 may be assumed to be pure active current. Thus, during chopper operation or chopper mode, an overvoltage-dependent direct current flowing through the inner resistor 243, 247 of the drive coil placed in the full bridge 241, 245 is controlled.

The full bridges or bridge circuits which are suitable for this purpose are identified by the control device 249 based on one or multiple criteria.

One criterion is, for example, a low degree of utilization of the thermal model of the individual drive coils. It thus means that the corresponding thermal load of a drive coil must be less than or equal to a predetermined thermal load threshold value, in order for such a drive coil to be used to impress the overvoltage-dependent current on said drive coil.

A further criterion is, for example, that no controller request is present for the corresponding bridge circuit, respectively, drive coil. It thus means that the corresponding drive coil is instantaneously not being used to drive a slide.

For example, according to one embodiment, multiple bridge circuits are mechanically integrated into a common model, wherein, for example, in the case of a known overvoltage in the intermediate circuit, all bridge circuits of the module may be identified as suitable for diverting the excess energy, so that, for example, the same voltage-dependent direct current may be adjusted in all drive coils of the module.

It thus means in particular that drive coils having a thermal load which is greater than, or greater than or equal to, the predetermined thermal load threshold value, are not used to divert the excess energy from the intermediate circuit by adjusting a voltage-dependent direct current.

As shown in FIG. 2, the stator device 201 comprises two bridge circuits 213, 215 by way of example. In other exemplary embodiments which are not shown, more than two bridge circuits are provided which, for example, are configured analogously to the bridge circuits 213, 215 and are connected to the first circuit node 205 and to the second circuit node 207, respectively, connected to these circuit nodes 205, 207.

In a linear drive system, the drive coils 241, 245 are arranged along a running rail. A slide, or multiple slides, are movably arranged on such a running rail. One magnet is arranged in each case as a rotor on the slides, so that the stator device, together with the rotor, forms a linear motor which may drive the slide(s).

For this purpose, it is provided that a direct current is impressed on the individual drive coils 241, 245, which results in a magnetic field being formed which interacts with the magnetic field of the rotor and may thereby drive or brake the slide.

The stator device 201 furthermore comprises an optional position detection device 265 for detecting a position of a magnetic rotor, wherein the criterion or the multiple criteria comprise the detected position of the magnetic rotor not being opposite the corresponding drive coils 241, 245. The position detection device 265 thus transmits the detected position to the control device 249.

In an embodiment not shown, the position detection device 265 is not provided.

Figure 3:
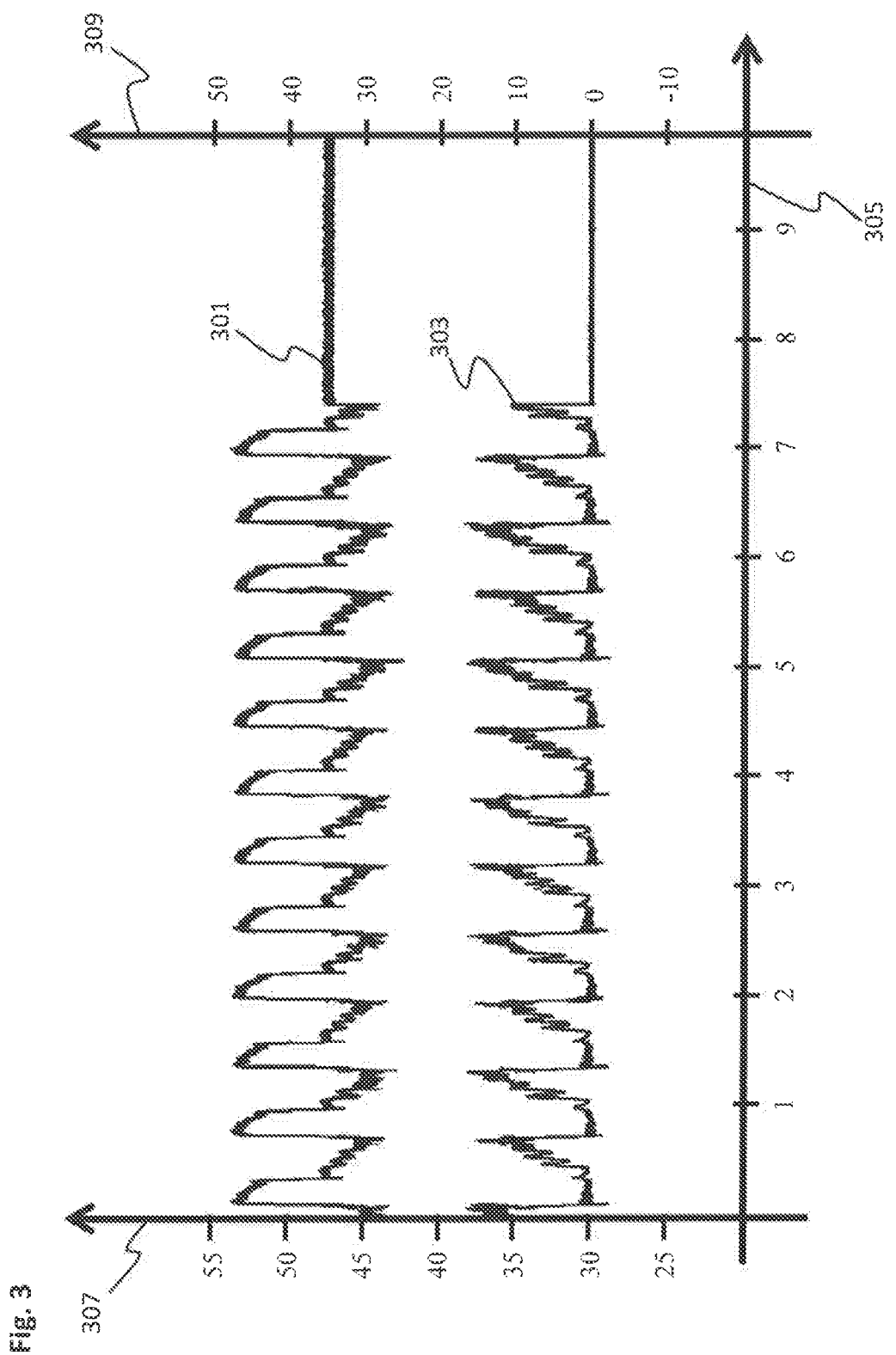
FIG. 3 shows temporal curves of an intermediate circuit voltage and a total current of a feed into multiple drive coils of a stator device.

FIG. 3 shows a temporal curve 301 of an intermediate circuit voltage and a temporal curve 303 of a total current of the feed into drive coils of a stator device.

The abscissa is labeled with the reference numeral 305 and indicates time in seconds.

The left ordinate is labeled with the reference numeral 307 and indicates the intermediate circuit voltage in volts.

The right ordinate is labeled with the reference numeral 309 and indicates the total current of the feed-in in amperes.

The two temporal curves 301, 303 were measured for 17 slides, each having 2 kg of payload, wherein the slides were moved in reversing operation. The speed of the slides was approximately 3 m/s with correspondingly high acceleration. No external chopper device was used.

By the reversing operation, electrical energy is fed back into the intermediate circuit, increasing an intermediate circuit voltage. This "surplus" of electrical energy is then again diverted from the intermediate circuit into drive coils, as described above and/or below. The curves 301, 303 show that by the control via the control device, it is advantageously made possible that the intermediate circuit voltage always remains under 55 volts, although no external chopper device is used for diverting the excess energy.

Here, the total current of the feed-in refers to the sum of the individual direct currents which were impressed on the drive coils for the purpose of diverting the excess electrical energy from the intermediate circuit.

This provides for using an integrated chopper mechanism (integrated into the bridge circuits) which is based on the idea of using the full bridges which are not used for driving, for diverting the excess energy from the intermediate circuit. Furthermore, it is provided, for example, to exclude the full bridges which, according to a thermal model, are already heavily thermally loaded, from the chopper mechanism. All remaining unused bridge circuits, along with their corresponding drive coils of the stator device, are used, for example, for the chopper mechanism.

The chopper mechanism is activated, for example, if a fixedly defined upper limit (predetermined intermediate circuit voltage threshold value) of the intermediate circuit voltage, for example, 53.0 volts, is exceeded.

A direct current which is proportional to the overvoltage of the intermediate circuit is adjusted on the full bridges used for the chopper mechanism, so that the fed-back energy in the inner resistor of the unused drive coils is dissipated, and a sharp excessive increase in the intermediate circuit voltage is effectively and efficiently prevented.

For example, it is provided that in the case of falling below a defined lower limit of the intermediate circuit voltage (a predetermined additional intermediate circuit voltage threshold value), the integrated chopper mechanism is deactivated.

It thus means that if the intermediate circuit voltage is less than, or less than or equal to, the predetermined additional intermediate circuit voltage threshold value, for example, 52.5 V, the controlling of the at least one of the DC voltage converters in such a way that electrical energy is fed from the intermediate circuit into the drive coil corresponding to the controlled DC voltage converter, is terminated.

The integrated chopper mechanism advantageously has no effect on the slides, since said chopper mechanism is triggered only on unused bridge circuits, respectively, drive coils. If drive coils used for the integrated chopper mechanism are again required for controlling a drive of a slide, the chopper mechanism is deactivated for these drive coils.

Advantages are in particular to be seen in an effective protection against a sharp excessive increase in the intermediate circuit voltage. As a result, for example, a bridge driver may be protected from an overvoltage. As a result, for example, an overvoltage fault, respectively, multiple overvoltage faults, may be avoided when braking a slide.

An additional advantage is in particular to be seen in a more rapid response to an overvoltage occurring in the intermediate circuit, compared to an external chopper device.

Furthermore, as a result, the technical advantage is achieved that an external chopper device may be relieved. In particular, as a result, an external chopper device may be conserved.

Thus, an overvoltage of the intermediate circuit voltage in a module in which multiple bridge circuits are mechanically attached, is effectively or efficiently prevented, wherein this in particular is independent of the conductor length.

Figure 4:
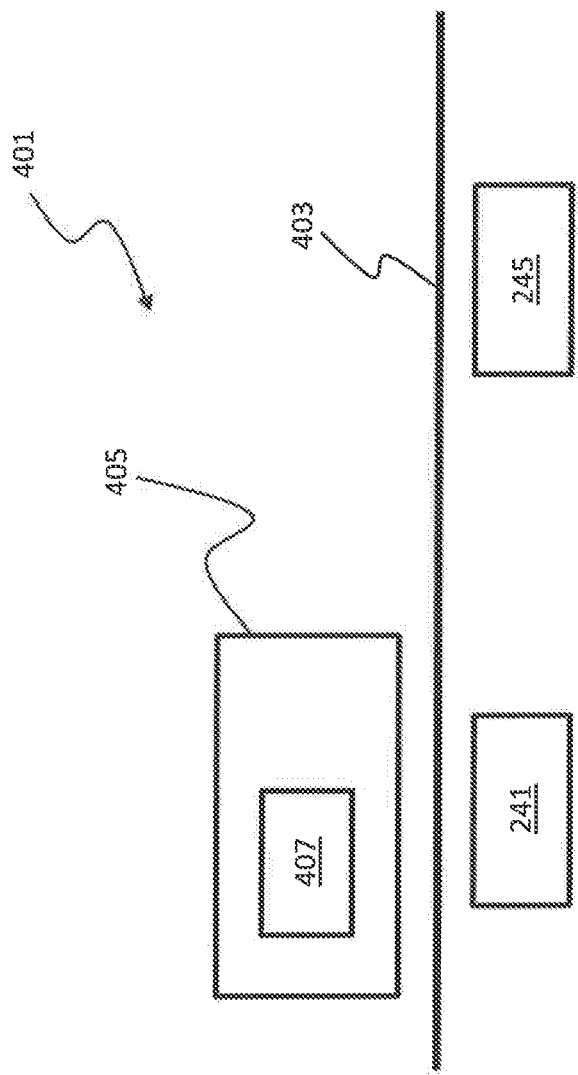
FIG. 4 shows a linear drive system.

FIG. 4 shows a schematically simplified view of a linear drive system 401.

The linear drive system 401 comprises a running rail 403 on which a slide 405 is movably arranged. For example, multiple slides 405 are provided which are movably arranged on the running rail 403.

For example, the slide 405 comprises one or multiple rollers. The running rail 403 comprises, for example, one or multiple running surfaces on which the rollers of the slide 405 may roll.

The slide 405 comprises a magnet 407, for example, a permanent magnet. For example, the slide 405 comprises multiple magnets 407.

The linear drive system 401 comprises the stator device 201 of FIG. 2, wherein for the sake of clarity, only the drive coils 241, 245 are shown. The two drive coils 241, 245 are arranged along the running rail 403.

Together with the magnet 407, the stator device forms a linear motor which may drive the slide 405.

If the drive coils 241, 245 are supplied with current, a magnetic field forms which interacts with the magnetic field of the magnet 407, so that driving, or braking in the case of corresponding current supply, of the slide 405, is thereby made possible.

If the slide 405 is braked, electrical energy is fed back into the intermediate circuit 203. If the intermediate circuit voltage thereby assumes a value which is greater than, or greater than or equal to, a predetermined intermediate circuit voltage threshold value, it is provided that the control device 249 controls at least one of the full bridges or bridge circuits 213, 215 in such a way that an overvoltage-dependent current is impressed on the corresponding drive coil 241, 245 in order to divert the excess energy from the intermediate circuit 203. Here, it is provided that only the drive coil is used which is instantaneously not being used for driving or for braking the slide 405.

In FIG. 4, the slide 405 is arranged above the first drive coil 241 by way of example, so that, for example, only the second drive coil 245 would be used here to divert excess energy from the intermediate circuit 203. If the slide 405 were then to be situated above the second drive coil 245 as it continues to move, the first drive coil 241 would be used rather than the second drive coil 245 to impress the overvoltage-dependent direct current on said first drive coil in order to divert the excess energy from the intermediate circuit 203.

Figure 5:
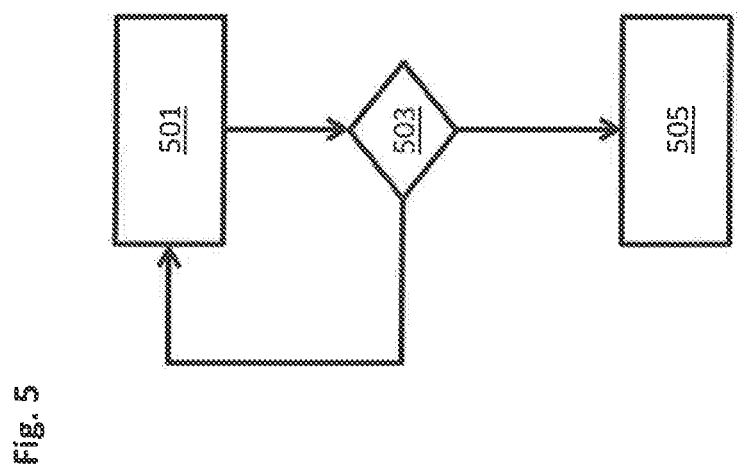
FIG. 5 shows a flow chart of a method for operating a stator device for a linear motor.

FIG. 5 shows a flow chart of a method for driving a stator device for a linear motor.

For example, the linear motor is comprised by a linear drive system.

In a step 501, the method provides that an intermediate circuit voltage is measured by the voltage measuring device. In a step 503, the measured intermediate circuit voltage is compared to a predetermined intermediate circuit voltage threshold value.

If the measured intermediate circuit voltage is less than a predetermined intermediate circuit voltage threshold value, the method is continued in step 501.

If the measured intermediate circuit voltage is greater than, or greater than or equal to, the predetermined intermediate circuit voltage threshold value, it is provided in a step 505 that at least one of the DC voltage converters is controlled via the control device in such a way that electrical energy is fed from the intermediate circuit into the drive coil corresponding to the controlled DC voltage converter.

For example, it is provided that the DC voltage converter is correspondingly controlled until the measured intermediate circuit voltage falls below a predetermined additional intermediate circuit voltage threshold value.

The invention has been illustrated and described in detail with the aid of the preferred exemplary embodiments. Nevertheless, the invention is not restricted to the examples disclosed. Rather, other variants may be derived therefrom by a person skilled in the art without departing from the protective scope of the invention.

What is claimed is:

1. A stator device for a linear motor, comprising:
multiple drive coils, each drive coil being configured to be independently impressed by a direct current so as to generate a magnetic field which is suitable to interact with a magnetic field of a magnetic rotor thereby to drive or to brake the magnetic rotor;
multiple DC voltage converters, each connected to a respective drive coil;
an intermediate circuit electrically conductively connected to each drive coil via the respective DC voltage converter, the intermediate circuit being configured to exchange energy with each drive coil via the respective DC voltage converter;
a voltage measuring device being configured to measure an intermediate circuit voltage; and
a control device connected to the voltage measuring device and to the multiple DC voltage converters, the control device being configured to independently control an active current of each DC voltage converter in such a way that electrical energy is fed from the intermediate circuit into the drive coil corresponding to the controlled DC voltage converter, if the measured intermediate circuit voltage is greater than, or greater than or equal to, a predetermined intermediate circuit voltage threshold value, wherein the control device is configured to control only those DC voltage converters, of which the corresponding drive coil meets at least one predetermined criterion;
wherein the intermediate circuit voltage is monitored by the control device and the at least one predetermined criterion is responsive to each of:
a determination that a respective ascertained thermal load of the drive coil is smaller than a predetermined thermal load threshold value, the thermal load being ascertained based on a thermal model, the thermal model including past measured drive coil values as input variables, the control device being configured to monitor the drive coils thermally and to ascertain the respective thermal load of the multiple drive coils,
a determination that the drive coil does not instantaneously participate in controlling to drive or brake of the magnetic rotor, and
a determination that a detected position of the magnetic rotor is not opposite the drive coil; and
wherein only the drive coils which fulfill the at least one predetermined criterion are used as the drive coils in which the electrical energy is to be fed in from the intermediate circuit.

2. The stator device according to claim 1, wherein the electrical energy fed from the intermediate circuit into the drive coils is distributed to the multiple drive coils.

3. The stator device according to claim 1, wherein the multiple drive coils and the corresponding DC voltage converters are respectively interconnected as bridge circuits, each drive coil respectively forming a bridge arm of the related bridge circuit.

4. The stator device according to claim 3, wherein the control device is configured to identify unused bridge circuits, wherein the at least one predetermined criterion comprises the determination that the drive coil does not instantaneously participate in controlling the drive or brake of the magnetic rotor.

5. The stator device according to claim 1, comprising a position detection device being connected to the control device and being configured to detect a position of the magnetic rotor, wherein the at least one predetermined criterion comprises the determination that the detected position of the magnetic rotor is not opposite the corresponding drive coils.

6. A linear drive system, comprising:
a linear motor comprising a stator, the stator comprising multiple drive coils and an intermediate circuit electrically conductively connected to each drive coil, the intermediate circuit being configured to exchange energy with each drive coil,
a running rail, the drive coils being arranged along the running rail,
at least one slide comprising a magnet acting as a rotor of the linear motor, the at least one slide being movably arranged on the running rail,
a voltage measuring device for measuring an intermediate circuit voltage, and
a controller, the controller being configured to independently control an active current of each drive coil, in such a way that electrical energy is fed from the intermediate circuit into the drive coils, if the measured intermediate circuit voltage is greater than, or greater than or equal to, a predetermined intermediate circuit voltage threshold value, wherein those drive coils are excluded from the feed-in of the electrical energy which are instantaneously being used for driving or braking the at least one slide and wherein those drive coils are excluded from the feed-in of the electrical energy which have a thermal load which exceeds a predetermined thermal load threshold value, the thermal load being ascertained based on a thermal model, the thermal model including past measured drive coil values as input variables, the controller being configured to monitor the drive coils thermally and to ascertain the respective thermal load of the multiple drive coils, the exclusion of the drive coil makes sure that the respective ascertained thermal load of the drive coil is smaller than the predetermined thermal load threshold value.

7. The linear drive system according to claim 6, wherein the stator device further comprises multiple DC voltage converters, each connected to a respective drive coil, the intermediate circuit being electrically conductively connected to each drive coil via the related DC voltage converter, the intermediate circuit being configured to exchange energy with each drive coil control via the related DC voltage converter, the control device being connected to the multiple DC voltage converters, the control device being configured to independently control each DC voltage converter in such a way that the electrical energy is fed from the intermediate circuit into the drive coil corresponding to the controlled DC voltage converter.

8. The linear drive system according to claim 6, wherein the drive coils and the related DC voltage converters are respectively interconnected as a bridge circuit, each drive coil respectively forming a bridge arm of the related bridge circuit, and wherein the controller is configured to identify unused bridge circuits.

9. The linear drive system according to claim 6, wherein the electrical energy fed from the intermediate circuit into the drive coils is distributed to the multiple drive coils.

10. The linear drive system according to claim 6, comprising a position detection device being configured to detect a position of the at least one slide, wherein those drive coils are excluded from the feed-in of the electrical energy which have a detected position opposite the at least one slide.

11. A method for operating a linear motor, the linear motor comprising a stator device, the stator device comprising multiple drive coils, the multiple drive coils being arranged along a running rail on which at least one magnetic rotor being movably arranged, wherein each drive coil is configured to be independently impressed by a direct current so as to generate a magnetic field which is suitable to interact with a magnetic field of the at least one magnetic rotor thereby to drive or to brake the at least one magnetic rotor, the stator device further comprising an intermediate circuit electrically conductively connected to each drive coil, the intermediate circuit being configured to exchange energy with each drive coil, the method comprising the steps:

measuring an intermediate circuit voltage, monitoring which of the multiple drive coils are instantaneously being used to drive or brake the at least one magnetic rotor, monitoring the multiple drive coils to determine an instantaneous thermal load of each drive coil, and if the measured intermediate circuit voltage is greater than, or greater than or equal to, a predetermined intermediate circuit voltage threshold value, generating a request specifying which of the multiple drive coils are to be supplied with an active current in order to divert excess electrical energy from the intermediate circuit into the multiple drive coils, wherein those drive coils are excluded from the feed-in of the excess energy which are instantaneously being used for driving or braking the at least one magnetic rotor and wherein those drive coils are excluded from the feed-in of the excess energy which have a thermal load which exceeds a predetermined thermal load threshold value, the thermal load being ascertained based on a thermal model, the thermal model including past measured drive coil values as input variables, the thermal monitoring of the drive coils being configured to ascertain the respective thermal load of the multiple drive coils, the exclusion of the drive coil makes sure that the respective ascertained thermal load of the drive coil is smaller than the predetermined thermal load threshold value.

12. The method according to claim 11, wherein the stator device further comprises multiple DC voltage converters, each connected to a respective drive coil, the intermediate circuit being electrically conductively connected to each drive coil via the related DC voltage converter, the intermediate circuit being configured to exchange energy with each drive coil via the related DC voltage converter, the control device being connected to the multiple DC voltage converters, wherein each DC voltage converter is independently controlled in such a way that the electrical energy is fed from the intermediate circuit into the drive coil corresponding to the controlled DC voltage converter.

13. The method according to claim 11, wherein the drive coils and the related DC voltage converters are respectively interconnected as a bridge circuit, each drive coil respectively forming a bridge arm of the bridge circuit, and wherein used bridge circuits are identified to determine which drive coils are instantaneously being used for driving or braking the at least one magnetic rotor.

14. The method according to claim 11, further comprising a step of determining those drive coils which have a detected positions opposite the at least one magnetic rotor.

15. The method according to claim 11, wherein the electrical energy fed from the intermediate circuit into the drive coils is distributed to the multiple drive coils.

* * * * *